(12) United States Patent
Weichmann et al.

(10) Patent No.: US 10,135,225 B2
(45) Date of Patent: Nov. 20, 2018

(54) LASER DEVICE WITH ADJUSTABLE POLARIZATION

(71) Applicant: KONINKLIJKE PHILIPS N.V., Eindhoven (NL)

(72) Inventors: Ulrich Weichmann, Aachen (DE); Mark Carpaij, Eindhoven (NL)

(73) Assignee: KONINKLIJKE PHILIPS N.V., Eindhonven (NL)

( * ) Notice: Subject to any disclaimer, the term of this patent is extended or adjusted under 35 U.S.C. 154(b) by 335 days.

(21) Appl. No.: 14/907,636

(22) PCT Filed: Jul. 28, 2014

(86) PCT No.: PCT/EP2014/066185
§ 371 (c)(1),
(2) Date: Jan. 26, 2016

(87) PCT Pub. No.: WO2015/014797
PCT Pub. Date: Feb. 5, 2015

(65) Prior Publication Data
US 2016/0164258 A1    Jun. 9, 2016

(30) Foreign Application Priority Data

Aug. 2, 2013  (EP) .................................... 13179072

(51) Int. Cl.
*G01C 3/08* (2006.01)
*H01S 5/183* (2006.01)
(Continued)

(52) U.S. Cl.
CPC .......... *H01S 5/18355* (2013.01); *G01B 11/25* (2013.01); *G01J 4/04* (2013.01);
(Continued)

(58) Field of Classification Search
CPC ...... H01S 5/18355; H01S 5/423; G01B 11/25
USPC ....................................................... 356/4.01
See application file for complete search history.

(56) References Cited

U.S. PATENT DOCUMENTS 5,617,076 A *  4/1997  Stern ...................... B64D 15/20
                                                340/583
7,873,090 B2 *  1/2011  Onishi ................... B82Y 20/00
                                                372/106

(Continued)

FOREIGN PATENT DOCUMENTS

EP    0781662 A2    7/1997
EP    0935321 A1    8/1999
(Continued)

OTHER PUBLICATIONS

Verschuuren, M.A. et al "Improved Performance of Polarization-Stable VCSELs by Monolighic Sub-Wavelength Gratings produced by Soft Nano-Imprint Lithography", Nanotechnology, vol. 22, 2011.

*Primary Examiner* — Mark Hellner (57) ABSTRACT

The invention describes a laser device (10) comprising an array (50) of laser emitters (100) and a control unit (200), the array (50) comprises at least a first sub array (110) of laser emitters and a second sub array (120) of laser emitters, wherein the first sub array (110) emits laser light of a first polarization and the second sub array (120) emits laser light of a second polarization being different from the first polarization, and wherein the control unit (200) is adapted to control the first sub array (110) and the second sub array (120) such that the polarization of the laser light emitted by the array (50) can be changed. The invention further describes a sensor device (300) and an optical detection system (400) comprising such a laser device (10). Furthermore, a method of determining the shape of an object by means of the optical detection system (400) is described.

20 Claims, 5 Drawing Sheets

(51) Int. Cl.
    *H04N 13/204*     (2018.01)
    *H01S 5/42*     (2006.01)
    *G01B 11/25*     (2006.01)
    *G01J 4/04*     (2006.01)
    *H01S 5/068*     (2006.01)
    *G06T 7/593*     (2017.01)

(52) U.S. Cl.
    CPC .......... *G06T 7/593* (2017.01); *H01S 5/06821* (2013.01); *H01S 5/18386* (2013.01); *H01S 5/423* (2013.01); *H04N 13/204* (2018.05)

(56) References Cited

U.S. PATENT DOCUMENTS

| | | |
|---|---|---|
| 8,213,480 B2 | 7/2012 | Giaretta |
| 2007/0058982 A1 | 3/2007 | Onishi |
| 2007/0153866 A1 | 7/2007 | Shchegrov |
| 2010/0226402 A1 | 9/2010 | Maeda |
| 2010/0265975 A1 | 10/2010 | Baier |
| 2011/0128525 A1* | 6/2011 | Mizuno .................. G01S 7/499 356/4.01 |
| 2011/0261174 A1 | 10/2011 | Silverstein |

FOREIGN PATENT DOCUMENTS

| | | |
|---|---|---|
| JP | 64009306 A | 1/1989 |
| JP | 7022706 B2 | 3/1995 |
| JP | 7091929 A | 4/1995 |
| JP | 2002213931 A | 7/2002 |
| JP | 2007258657 A | 10/2007 |
| JP | 2008060433 A | 3/2008 |
| JP | 2009094308 A | 4/2009 |
| WO | 200105008 A1 | 1/2001 |

\* cited by examiner

LASER DEVICE WITH ADJUSTABLE POLARIZATION

CROSS-REFERENCE TO PRIOR APPLICATIONS

This application is the U.S. National Phase application under 35 U.S.C. § 371 of International Application No. PCT/EP2014/066185, filed on Jul. 28, 2014, which claims the benefit of European Patent Application No. 13179072.7, filed on Aug. 2, 2013. These applications are hereby incorporated by reference herein.

FIELD OF THE INVENTION

The invention relates to a laser device with adjustable polarization, a sensor device and an optical detection system comprising such a laser device. The invention further relates to a method of determining a three dimensional shape of an object.

BACKGROUND OF THE INVENTION

WO 01/05008 A1 discloses the control of polarization of the laser emission of a Vertical Cavity Surface Emitting Lasers (VCSELs). Furthermore, the fabrication of arrays of polarization controlled VCSELs of the same polarization by means of one dimensional grating structure over the entire array of VCSELs in a single processing step is described.

The described arrays lack of flexibility such that the potential applications are limited.

SUMMARY OF THE INVENTION

It's thus an object of the present invention to provide an improved laser device with improved flexibility.

According to a first aspect a laser device comprising an array of laser emitters and a control unit is proposed. The array comprises at least a first sub array of laser emitters and a second sub array of laser emitters, wherein the first sub array emits laser light of a first polarization and the second sub array emits laser light of a second polarization being different from the first polarization. The first sub array and/or the second sub array comprise subsets of the laser emitters. The control unit is adapted to control the first sub array and the second sub array such that the polarization of the laser light emitted by the array can be controlled. At least the laser light emitted by a first subset is not coherent to laser light emitted by a second subset. The control unit is further adapted to control subsets of the laser emitters of the first sub array and/or the second sub array independently such that the coherence of the emitted laser light can be controlled.

The laser emitters are preferably semiconductor lasers as Vertical Cavity Surface Emitting Laser (VCSEL) or side emitter. VCSEL may have the advantage that they can be produced on wafer scale such that arrays of VCSELs emitting laser light of different polarization can be produced by means of a surface grating on top of the light emitting surface on each VCSEL. The surface gratings of a multitude of VCSEL can be produced in one etching step. Side emitters may have the advantage that they are inherently polarized. No additional technical measures are thus needed in order to get laser emitters of a defined polarization.

The first sub array and the second sub array may be integrated on one chip. The chip may comprise a first contiguous area of laser devices emitting laser light of the first polarization and a second contiguous area of laser devices emitting laser light of the second polarization. The chip may also comprise three, four or more contiguous areas comprising sub arrays of laser emitters emitting laser light of a third, fourth or more polarization. It may also be possible that two or more sub arrays provided on contiguous areas emit laser light of the same polarization. Such contiguous areas may be squares, rectangles, triangle or line or stripes of laser devices emitting laser light of the first and second polarization.

Alternatively, the sub arrays may share the same area on the chip. Adjacent laser emitters may emit in this case laser light of different polarization. There may be only two different kinds of laser emitters emitting laser light of different polarization arranged, for example, in a checker board or hexagonal pattern. In an alternative approach three, four or more laser emitters emitting laser light of different polarizations may be subsequently arranged in a line in a repetitive order or in two or more lines. The sequence of the laser emitters in the lines may be shifted or the order may even be changed. The pattern of laser emitters emitting laser light of different polarization may thus be regular or irregular. Arranging the laser emitters emitting laser light of different polarization next to each other may have the advantage that a pattern of laser dots of different polarization may be directly projected onto an object without additional optical elements. A simple arrangement of lenses may be sufficient to widen such a pattern of laser dots.

The sub arrays of laser emitters emitting laser light of a defined polarization may alternatively be arranged on different chips. Different polarizations may in this case be enabled by turning the chips relative to each other by, for example, 45°, 90°, 120° or other angles depending on the number of chips or sub arrays used within the array and the number of polarizations needed for the respective application.

The control unit may control the sub arrays independently with respect to each other. The polarization of the laser light emitted by the laser device may thus continuously be changed from laser light of the first polarization (only the first sub array emits laser light) to laser light without polarization (both sub arrays emit laser light of the same intensity) to laser light of the second polarization (only the second sub array emits laser light). An additional polarizer under the right angle may be added, such that the polarization can be switched between left and right circularly polarized. A more sophisticated control may be enabled by coherent coupling of the laser devices of each sub array allowing even in the case of only two sub arrays a continuous change of the angle of polarization.

The laser emitters of the sub arrays are arranged in subsets. The subsets are controlled independently by means of the controller. The latter may enable a simplified control of the laser device in comparison to the control of each laser emitter. The laser devices of the subsets may be coherently coupled such that the coherence of the laser light emitted by the sub arrays may be controllable. A subset of coherent laser devices may emit in this case coherent laser light of a defined polarization whereby two or more subsets of the sub array emit incoherent laser light of the defined polarization if they are controlled by means of the controller to emit laser light at the same time.

Several sub arrays of different polarization may enable to emit laser light of more than two polarizations by switching on the respective sub array by means of the controller of the laser device. The power provided to each sub array may be controllable in a continuous way. Furthermore it may be possible to power only a part of the laser emitters or even single laser of the sub array by means of the controller. The controller will be connected to an external power supply or an internal power supply e.g. battery.

A sensor device may comprise the laser device described above and a detector. The detector may be adapted to detect the different polarizations of laser light emitted by the sub arrays after reflection of the emitted laser light by an object. The detector may comprise a camera chip like a Charge Coupled Device (CCD) or the like and a polarization filter. The polarization filter may be fixed or controllable by means of a control module. A controllable polarization filter may enable to adjust the polarization of the laser light received by the camera chip automatically. It may also be possible to use a detector without polarization filter. The control module may in this case be adapted to submit the laser light of different polarizations in a way that no polarization filter is needed. A control signal may, for example, be submitted by means of the laser device and received by means of the detector such that the polarization of the laser light is identified by means of the control signal. The control signal may be used in subsequent processing by means of, for example, the control module of the sensor or an analyzing unit the sensor device is coupled with in order to identify the respective polarization of the laser light. An object may be illuminated with laser light of changing polarizations and local variations of the intensity of the reflected laser light in combination with the information about the polarization of the emitted laser light may enable an analysis of the surface properties of the object.

In an alternative approach a polarizing beam splitter and two camera chips are used. The polarizing beam splitter may be arranged to transfer laser light of a first polarization to a first camera chip and laser light of a second polarization to a second camera chip such that the intensities of the laser light of the two polarizations can be independently detected. The laser device may in this case only provide laser light of two different preferably orthogonal polarizations. The polarizing beam splitter may be a beam splitter in combination with two polarization filter with orthogonal polarization.

An optical detection system may comprise the laser device described above. The optical detection system further comprises a receiver and a processing unit. The processing unit may be any kind of processor, microprocessor or computer including one or more memory devices. The laser device may be adapted to emit a pattern of laser light comprising at least a first sub pattern of laser light with a first polarization and a second sub pattern of laser light with a second polarization. The receiver may be adapted to receive the first and the second sub pattern emitted by the laser device reflected by an object, and the processing unit may be adapted to determine the shape of the object by means of the reflected first and second sub pattern.

The receiver may, for example, comprise a camera chip and a polarization filter of a defined polarization. The processing unit may communicate with the control unit of the laser device. The laser device may emit a pattern of dots with different polarization and exchange the respective information with the processing unit such that the processing unit is informed about the respective pattern. Each pattern may comprise a unique identifier emitted by means of the laser device, for example, prior to the emission of the pattern such that the processing unit is informed when the respective pattern is received by means of the receiver. The control unit may further be adapted to change the pattern. The processing unit may thus be able to determine the shape of the object by comparing the information about the emitted pattern and the received pattern based on a multitude of different patterns.

The detector may comprise in an alternative approach a detector with a controllable polarization filter. The laser device may emit in this case a constant pattern and the control module may change the setting of the controllable polarization filter such that laser light of different polarizations can pass the controllable polarization at different times. Information about the emitted pattern, the distortion of the received pattern and the intensity of the dots of the pattern in relation to the setting of the controllable polarization filter may be used by means of the processing unit in order to determine the shape of the object.

The optical detection system may further comprise a camera for recording a picture of the object. The processing unit may be adapted to determine a three-dimensional picture of the object based on the determined shape of the object and the picture of the object. The information provided by means of a conventional camera may be combined with the determined shape of the object. It may thus be possible to provide a realistic three dimensional picture of the object. Furthermore, the use of a polarization filter in front of the receiver reduces the intensity of the ambient light by 50% such that the contrast of the pattern may be improved. The pattern is preferably emitted in a different wavelength as the picture (e.g. infrared spectrum in comparison to visible spectrum recorded by the camera) such that the pattern of laser light may not disturb recording of the picture by means of the camera.

According to a further aspect of the present invention a method of determining the shape of an object is provided. The method comprises the steps of:

emitting a pattern of laser light comprising at least a first sub pattern of laser light with a first polarization and a second sub pattern of laser light with a second polarization;

controlling by means of a control unit a coherence of laser light by means of independently controlling subsets of laser emitters of a first sub array and/or a second sub array, wherein at least the laser light emitted by a first subset is not coherent to laser light emitted by a second subset;

receiving laser light of the pattern of laser light reflected by an object; and determining the shape of the object using the received laser light of the first and the second sub pattern.

The information provided by means of the first and the second sub pattern may improve the determination of the shape of the object by providing additional information via the different polarization of the laser light in the sub pattern.

The method may comprise the additional step of providing the pattern of laser light, wherein the pattern changes in time and providing information about the change to a processing unit such that the shape of the object is determined based on the information.

In an alternative approach the method comprises the step of changing the setting of a controllable polarization filter such that laser light of different polarization can be filtered in order to provide additional information about the object.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

DETAILED DESCRIPTION OF EMBODIMENTS

Various embodiments of the invention will now be described by means of the Figures.

Figure 1:
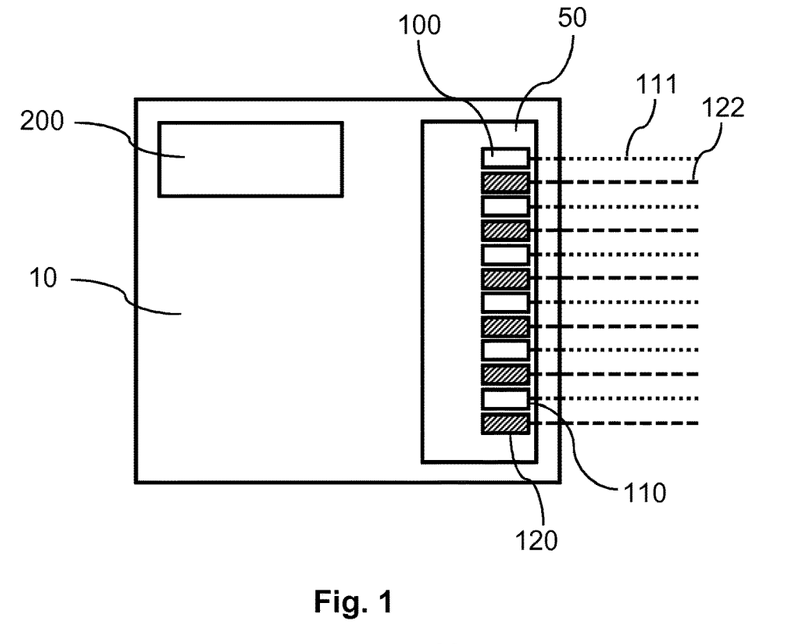
FIG. 1 shows a principal sketch of a first laser device

FIG. 1 shows a principal sketch of a first laser device 10. The laser device 10 comprises a control unit 200 and an array 50 of laser emitters 100. The laser emitters 100 are arranged in a first sub array of laser emitters 110 emitting laser light of a first polarization 111 and a second sub array of laser emitters 120 emitting laser light of a second polarization 122. The laser emitters 100 are, for example, Vertical Cavity Surface Emitting Lasers (VCSELs) with a grating provided on the laser light emitting surface of the VCSELs in order to set the polarization of the laser light emitted by the respective VCSEL. The control unit 200, a microprocessor or the like, is adapted to control the first and the second sub array of laser emitters 110, 120 independently. The first sub array of laser emitters 110 may, for example, be powered at a time $t_1$ when the second sub array of laser emitters 120 is not powered. At a time $t_2$ after $t_1$ the second sub array of laser emitters 120 is powered when the first sub array of laser emitters 110 is not powered. The control unit may also be adapted to power each of the first and the second sub arrays of laser emitters 110, 120 at each intermediate power level between zero power and full power. Furthermore, both sub arrays may be powered at the same time. The polarization state of the emitted laser light 111, 122 may thus be controlled in a continuous way.

Figure 2:
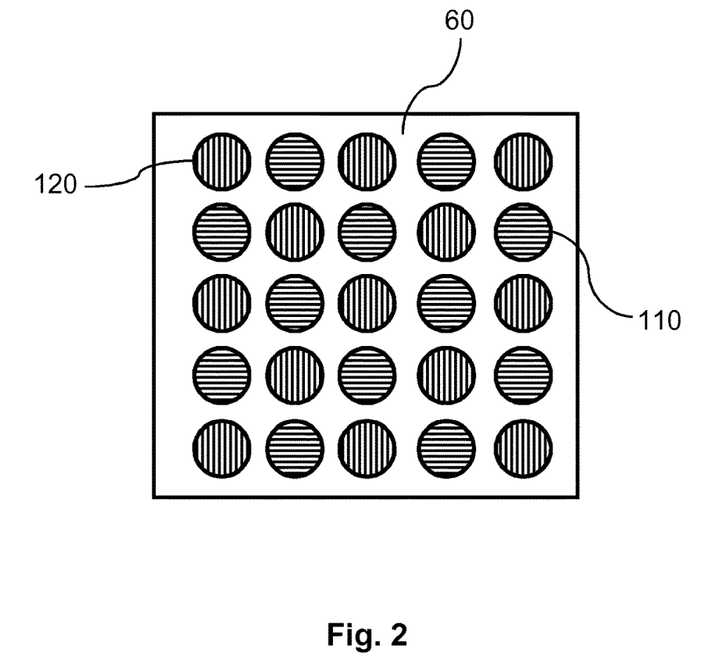
FIG. 2 shows a principal sketch of a first laser array

FIG. 2 shows a chip 60 on which the VCSELs 100 of the laser array 50 are arranged and attached to. The first and the second sub arrays of laser emitters 110, 120 are arranged in a checker board pattern and emit laser light of a first polarization 111 and laser light of a second polarization 122 being perpendicular or orthogonal to the first polarization. A checker board pattern as well as, for example, a hexagonal pattern or the like may have the advantage that no optical element may be needed in order to overlap the emission of the respective sub array. As long as the single VCSELs in the array 50 are not coherently coupled, the polarization of the array emission can only be varied between polarized in the two orthogonal polarization directions and unpolarized emission with varying degree of polarization. An additional polarizer may be added under the right angle, so that the polarization can be switched between left and right circularly polarized. Additional measures to coherently couple the emission of all elements in the array 50 that emit the same polarization will allow changing the angle of the polarization continuously. Such measures for coherent coupling of VCSELs are for example described in J. Baier, U. Weichmann; Extended cavity semiconductor laser device with increased intensity, US 2010/0265975 A1.

Alternatively more than two sub arrays may be arranged on the chip 60 if adjacent laser emitters 100 do emit laser light of different polarization. The polarization of laser emitters 100 may, for example, change stepwise for 120° in case of three sub arrays, wherein in the case of four sub arrays the polarization may change for 45°. In this way a multitude of different polarization states are possible. It may even be possible to have an irregular pattern of laser emitters 100 with different polarization. The latter may be easily enabled by means of VCSELs produced in wafer process such that only one mask is needed in order to define the polarization of the laser light emitted by each VCSEL by providing different surface gratings in one etching step. The polarization of the sub arrays may be stored in a memory device of the control unit 200 or it may be determined by means of a suitable detector receiving only laser light of a defined polarization state in a calibration procedure. The laser light emitted by the laser emitters 100 of the array 50 may be manipulated by means of suitable optical elements. A lens may, for example be used to widen the beam of emitted laser light. Mirrors may be used to change the direction of the complete beam or parts of the beam.

Figure 3:
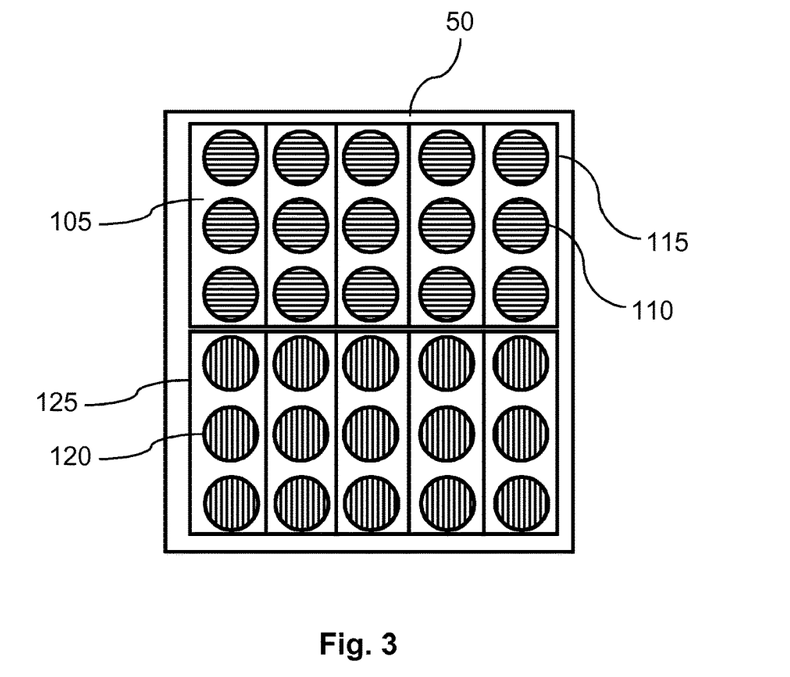
FIG. 3 shows a principal sketch of a second laser array

FIG. 3 shows an alternative arrangement of laser emitters 100 in an array 50. A first chip 115 comprising 5 subsets of laser emitters 105 emitting laser light of a first polarization and a second chip 125 comprising 5 subsets of laser emitters 105 emitting laser light of a second polarization is depicted. Each subset of laser emitters 105 can be driven independently. The number of laser emitters 100 per subset and the number of subsets per polarization may determine the degree of control about the polarization of the laser light emitted by means of the array 50 in case the subsets can only be switched on and off. The latter may limit the complexity of the control unit 200 needed to control the array 50. A continuous control may be enabled if the power supplied to each subset of laser emitters 105 can be controlled in a continuous way. The laser emitters 100 are in this case edge emitting laser diodes emitting polarized laser light. 15 edge emitting lasers are arranged on the first chip 115 and further 15 on the second chip 125 and aligned with respect to the polarization of the laser light emitted by means of the edge emitting laser. The polarization of the laser light emitted by means of the laser emitters 100 arranged on the second chip is twisted by 90° by twisting the edge emitting lasers by 90° in comparison to the edge emitting lasers attached to the first chip 115. Alternatively, the laser emitters may be arranged in the same way with respect to polarization of the emitted on each sub array of laser emitters 110, 120. The latter means that the polarization of the emitted laser light with respect to the longer side of the first or second chip 115, 125 may be the same. The polarization of the emitted laser light may be twisted by means of twisting the first and the second chip 115, 125 relative to each other. The shape of the chips may be used in this case to arrange the sub arrays. Chips with laser emitters 100 with the shape of an equilateral triangle may be used to provide laser light of three different polarizations in an easy way by simply turning the chips on a suitable circuit board. The shape of the chips may determine the number of possible polarizations of the emitted laser light. Alternatively, it may also be possible to provide quadratic or circular chips and arrange these chips on a circuit board or base chip in order to provide as much different polarizations of the emitted laser light as needed for the respective purpose. The size and number of laser emitters 100 per array 50, sub array 110, 120 or subset 105 may be used to control the coherence of the emitted laser light. Only coherently coupled laser emitters 100 emit coherent laser light. The coherence may thus be controlled by means of the control unit 200 by means of using subsets 105 or sub arrays which are not coherently coupled. It may even be favorable to combine single laser emitters 100 in an array 50 which are not coherently coupled.

Figure 4:
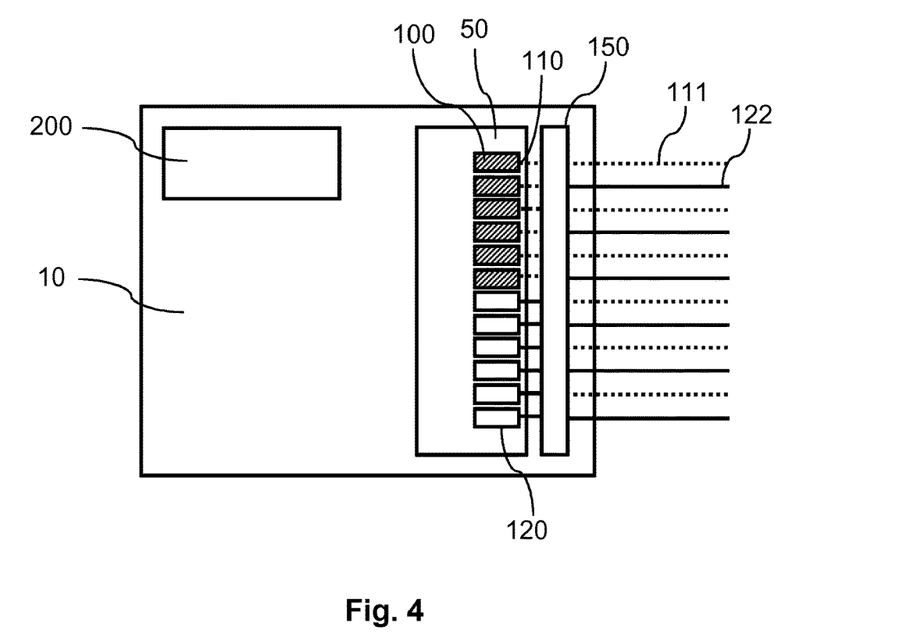
FIG. 4 shows a principal sketch of a second laser device

FIG. 4 shows a laser device 10 comprising an array 50 depicted in FIG. 3. The control unit 200 controls each subset of laser emitters 105 by simply switching the subset on or off. The laser device 10 further comprises an optical device 150 in order to superimpose the laser light emitted by the first and the second sub array of laser emitters 110, 120. The optical device 150 may comprise two diffractive elements in order to provide, for example, a superimposed checker board pattern of laser spots with alternating polarization of the laser light. Alternatively, arrangements of mirrors, semitransparent mirrors and lenses may be used to provide similar patterns.

Projection lenses may be used in addition or alternatively to provide a pattern of lines with different polarization of the laser light of adjacent lines. The lines may be projected in a vertical or a horizontal direction with respect to a reference surface. The projection lenses and/or additional optical elements may even by switchable such that, for example, the pattern of lines can be switched between vertical and horizontal. Furthermore, more sophisticated patterns and switching states may be enabled by means of suitable optical devices 150. Switching of the optical device 150 may be controlled by means of the control unit 200. Alternatively, an additional control device may be used to control switching of the optical device 150. Optical devices 150 discussed in the framework of the embodiment shown in FIG. 4 may also be used to enable switching the pattern of laser beams emitted by a laser device 10 shown in FIG. 1.

Figure 5:
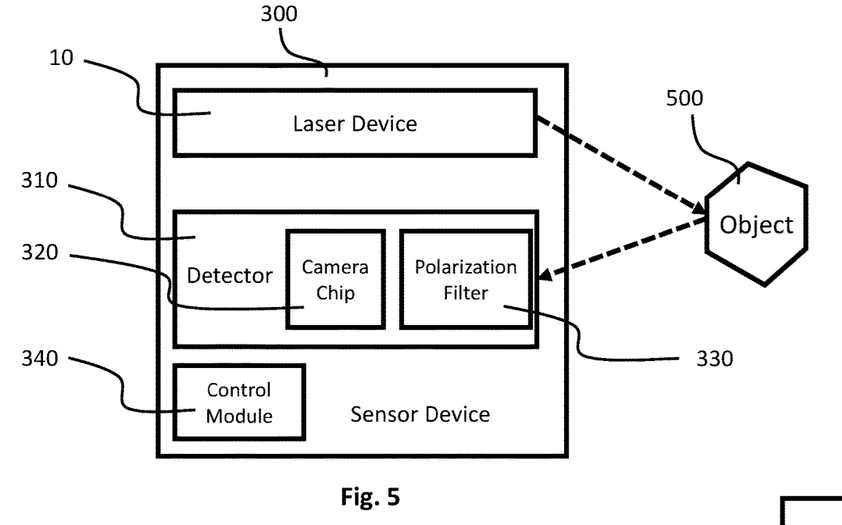
FIG. 5 shows a principal sketch of a sensor device

FIG. 5 shows a principal sketch of a sensor device 300 in accordance with an embodiment of the present invention. The sensor device 300 comprises a laser device 10 as, for example, discussed above. The laser device 10 emits laser light of a first polarization and a second polarization perpendicular to the first polarization. The laser light is reflected by an object 500 and received by means of a camera chip 320 after passing an adjustable polarization filter 330. The camera chip 320 and the polarization filter 330 are part of a detector 310. A control module 340 controls the detector 320 and comprises a memory device (not shown) for storing the measurement results received by means of the detector 310. The polarization of the laser light passing the polarization filter may be, for example, adjusted by means of the control module 340.

The control module 340 may in an alternative approach be adapted to control the laser device 10. This may happen via the control unit 200 of the laser device 10. The control unit 200 may in this case be triggered by means of the control module 340. The control module 340 may control the laser device 10 such that the laser device 10 emits laser light of the first polarization at time $t_1$ and laser light of the second polarization at a subsequent time $t_2$. The control module 340 may know in this case when laser light of a defined polarization is emitted and the time when the respective laser light is received by means of the detector may be calculated if the distance to the object 500 is known. The distance to the object 500 may be fixed in certain applications of the sensor device 300 but in other applications a distance measurement may be needed. Such distance measurements may, for example, be performed by means of time of flight measurements or laser self-mixing using a suitable distance sensor (not shown) which may be controlled by means of the control module 340. A polarization filter 330 may be superfluous in such cases. The control module 340 determines the polarization of the laser light based on the time of emission of the laser light with a defined polarization and the time of receiving the respective laser light based on the known distance. It may be even possible to waive the distance sensor in case of an unknown distance. The control module 340 may, for example, emit a unique sequence of laser pulses be specific for each polarization of the laser light emitted by the laser device 10. The detector 310 determines the respective polarization of the received laser light by means of the sequence of laser pulses such neither a polarization filter 330 nor any knowledge about the distance to the object 50 may be necessary. This approach of identifying a measurement beam of laser light may be used in each case where the emitted laser light is characterized in certain way as, for example, a defined polarization as discussed above or a defined coherence. The control module 340 and the control unit 200 may even be one device controlling both the laser device 10 and the detector 310. The sensor device 300 may further comprise optical elements and/or mechanical elements which are adapted to direct or focus the laser light to the object 500. The laser device 10 and/or the detector 310 may, for example, be rotatable around one or more axes.

The sensor device 300 may be used in biosensor applications like, for example, handheld diagnostics. This biosensor gives a simple way to switch between bright- and dark-field detection. The reflected light from one polarization leads to a signal (bright field), while the other polarization will not lead to any signal (dark field). Particles on the surface will scatter the laser light emitted by the laser device 10 and change the polarization of the laser light, so they are seen as dark spots in bright-field detection and as signal in dark-field detection. In that way both ways of detection can be used and a high sensitivity reached.

Many more examples of potential applications for the sensor device 300 can be found in the fields of spectroscopy and sensing. The ability of simple switching between bright and dark field detection can be used to increase the sensitivity of these applications. Another field of application for such sensor devices 300 is photochemistry, where different chemical reactions can be steered by changing the polarization of the excitation.

Figure 6:
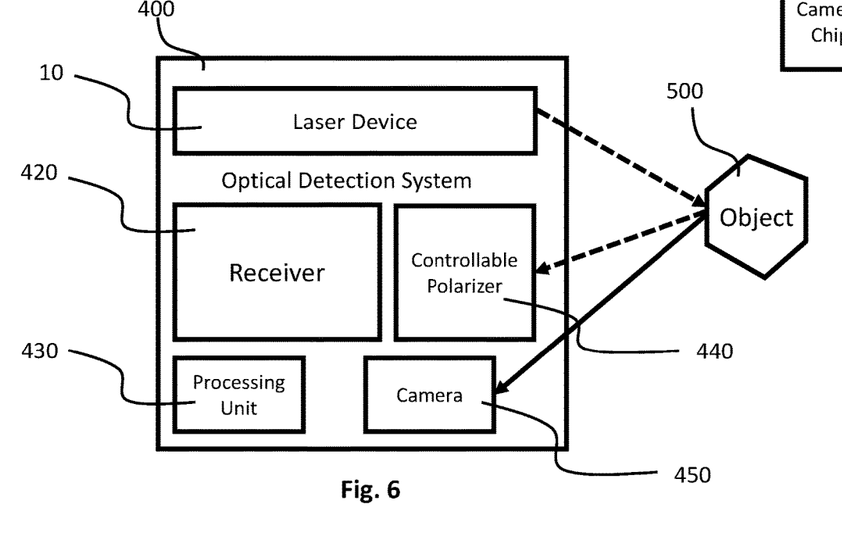
FIG. 6 shows a principal sketch of an optical detection system
Figure 7:
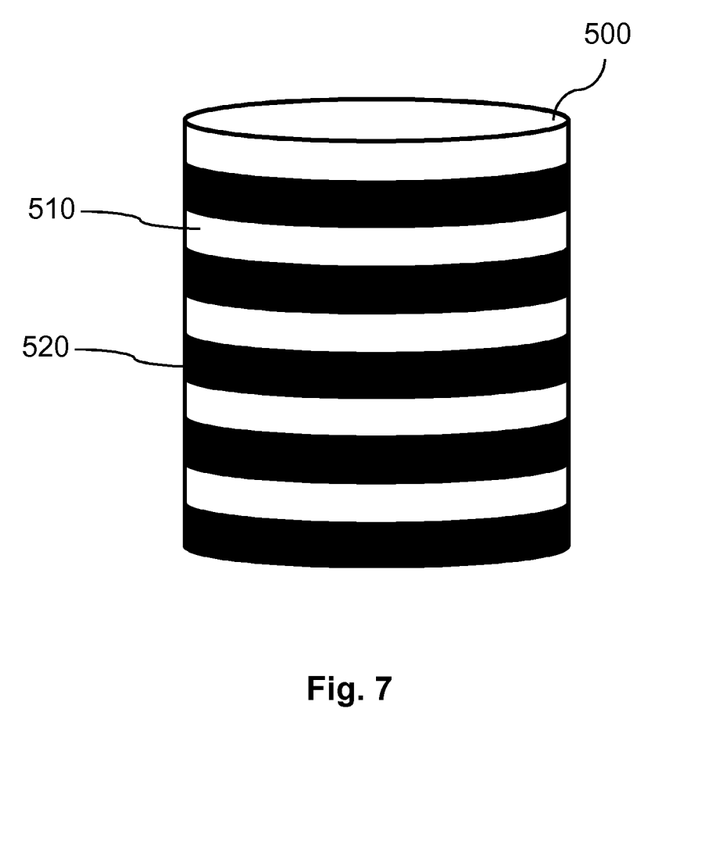
FIG. 7 shows a principal sketch of an object illuminated by means of pattern of lines of laser light with different polarization

FIG. 6 shows a principal sketch of an optical detection system 400. The optical detection system 400 comprises a laser device 10 emitting a pattern of laser light with different polarizations. The pattern may be a line pattern with alternating lines of laser light of different polarization as depicted in FIG. 7. FIG. 7 shows a cylinder illuminated by means of the laser device 10 with a line pattern. A first sub pattern 510 comprises laser light of a first polarization parallel to the surface the object 500 is placed on and a second sub pattern 520 of laser light of a second polarization orthogonal to the surface the object 500 is placed on.

Alternatively, a dot pattern of laser spots having different polarizations with respect to adjacent laser spots may be emitted by means of the laser device 10. The pattern may be regular or irregular. The optical detection system 400 further comprises a receiver 420 as, for example, a camera chip for receiving laser light reflected by the object 500 and a controllable polarizer 440. The controllable polarizer 440 is switched by means of a processing unit 430 between the different polarizations of laser light emitted by the laser device 10. The processing unit 430 may be used to control the laser device 10, the receiver 420 and the controllable polarizer 440 in the same or similar way as described with respect to the sensor device discussed above. The processing unit 400 may be further adapted to determine the three dimensional shape of the object 500 based on the distortion of the pattern caused by the shape of the object 500. The polarization of the laser light is used to improve the uniqueness of the emitted pattern. This may enable an improved detection of three dimensional objects in comparison to known approaches using structured light for three dimensional detection by means of triangulation because the different polarization add additional information to the pattern. Especially changing patterns of, for example, vertical and parallel lines of different polarization in a subsequent order may improve the detection by providing information about the shape of the object 500 in the horizontal and vertical direction. Using polarized light may increase the contrast because light of a polarization which is blocked by the adjustable polarization filter 440 does not disturb the measurement. Furthermore, known but highly unique patterns of a multitude of different polarizations as discussed above may be projected on a three dimensional object. The different spots of a defined polarization may be detected by means of the receiver 420 after passing the adjustable polarization filter 440. If more than two polarizations are used the intensity of the received laser light may be used as additional information because only a defined part of the reflected laser light with a polarization not parallel to the adjustable polarization filter 440 passes the adjustable polarization filter 440 and is received by means of the receiver 420. It may also be possible to subsequently send sub patterns of laser light with two or more polarization by controlling the laser emitters 100, the subsets of laser emitters 105 or the sub arrays accordingly. The processing unit 430 may process the patterns received by the receiver 420 such that even the shape of a moving object 500 may be determined A three dimensional film of the moving object 500 may thus be provided.

The optical detection device shown in FIG. 6 further comprises an optional camera 450 for receiving a conventional picture of the object 500. The laser device 10 may comprise laser emitters 100 like VCSEL emitting laser light in the infrared spectral range. The laser pattern thus does not disturb recording of the conventional picture by means of the camera 450. Furthermore, ambient light reflected by the object 500 and passing the controllable polarization filter 440 is damped by 50%, whereby the laser light in line with the controllable polarization filter 440 passes the filter without damping. The contrast of the received pattern in relation to ambient light may thus be improved. In addition a spectral filter may be added to the receiver 420 such that ambient light outside of the spectral range of the laser emitters 100 does not contribute to signal received by means of the receiver 420. Using VCSEL as laser emitters 100 may have the additional advantage that the shape of the aperture of adjacent VCSELs may be different by using an appropriate etching mask in the production process. The aperture of the VCSELs influences the form of the projected laser dots such that this additional measure may be used to add further information to the pattern of laser light.

Figure 8:
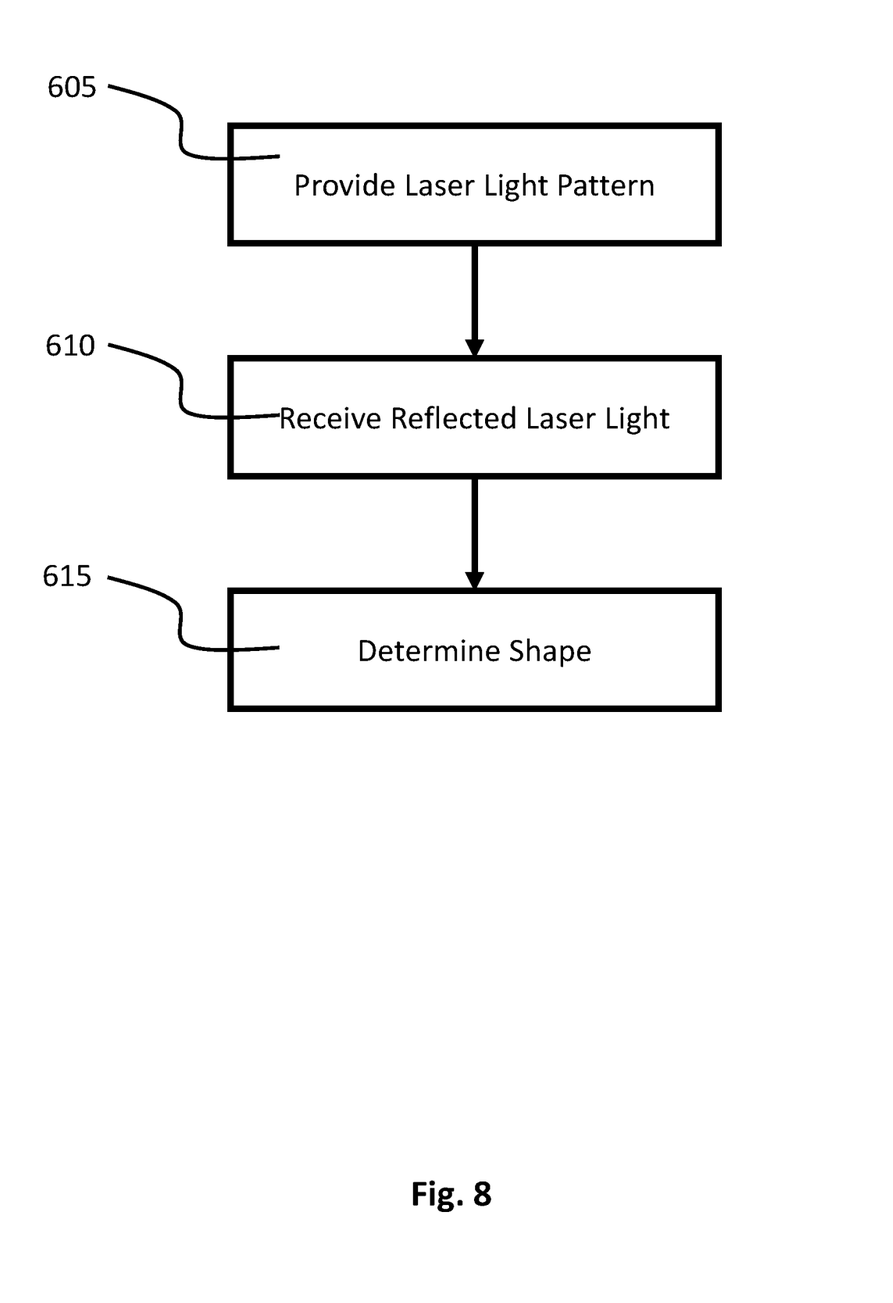
FIG. 8 shows a principal sketch of a method of determining the shape of an object In the Figures, like numbers refer to like objects throughout. Objects in the Figures are not necessarily drawn to scale.

FIG. 8 shows a principal sketch of a method of determining the shape of an object 500. In step 605 a pattern of laser light comprising at least a first sub pattern of laser light with a first polarization 510 and a second sub pattern of laser light with a second polarization 520 is provided. In step 610 laser light of the pattern of laser light reflected by an object 500 is received. In step 615 the shape of the object 500 is determined based on the received laser light.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 10 laser device
50 array
60 chip
100 laser emitters
105 subset of the laser emitter
110 first sub array of laser emitters
111 laser light of a first polarization
115 first chip
120 second sub array of laser emitters
122 laser light of a second polarization
125 second chip
150 optical device
200 control unit
300 sensor device
310 detector
320 camera chip
330 polarization filter
340 control module
400 optical detection system
420 receiver
430 processing unit
450 camera
440 adjustable polarization filter
500 object
605 step of emitting a pattern of laser light
610 step of receiving laser light of the pattern of laser light reflected by an object
615 step of determining the shape of the object

The invention claimed is:

1. A device comprising:
   a detector,
      wherein the detector is arranged to detect different polarizations of laser light,
      wherein the detector comprises a camera chip and a polarization filter;
   an array of laser emitters, the array comprising at least a first sub array of laser emitters and a second sub array of laser emitters; and
   a control circuit,
      wherein the first sub array emits a first laser light of a first polarization, wherein the second sub array emits a second laser light of a second polarization,
wherein the second polarization is different from the first polarization,
wherein the control circuit is arranged to change the first polarization and the second polarization,
wherein the control circuit is arranged to control the first sub array and/or the second sub array independently,
wherein the first laser light is not coherent to the second laser light,
wherein the control circuit is arranged to control the coherence of the first laser light and the second laser light.

2. The device according to claim 1,
wherein the laser emitters are Vertical Cavity Surface Emitting Lasers,
wherein the Vertical Cavity Surface Emitting Lasers comprise a grating.

3. The device according to claim 2, wherein the first sub array and the second sub array are integrated on one chip.

4. The device according to claim 1, wherein the first sub array is arranged on a first chip and the second sub array is arranged on a second chip.

5. The device according to claim 3, wherein at least a portion of the first sub array and at least a portion of the second sub array are arranged in a checkerboard pattern.

6. The device according to claim 1,
wherein the array comprises a plurality of sub arrays,
wherein each sub array emits a laser light of a different polarization,
wherein the control circuit is arranged to control each sub array independently.

7. The device according to claim 1,
wherein the polarization filter is a controllable polarization filter,
wherein the detector comprises a control circuit,
wherein the control circuit is arranged to control the polarization filter such that a polarization of the laser light received by the camera can be automatically adjusted.

8. An optical detection system comprising:
a device according to claim 1;
a receiver circuit; and
a processing circuit;
wherein the device is arranged to emit a pattern of laser light,
wherein the pattern comprises at least a first sub pattern of laser light and a second sub pattern of laser light,
wherein the first sub pattern has a first polarization,
wherein the second sub pattern has a second polarization,
wherein the receiver circuit is arranged to receive the first and the second sub patterns emitted by the laser device and reflected by an object,
wherein the processing circuit is arranged to determine a shape of the object using a reflected first pattern and a reflected second sub pattern.

9. The optical detection system according to claim 8, further comprising a controllable polarization filter,
wherein the processing circuit is arranged to control a polarization of laser light received by the receiver circuit using the controllable polarization filter.

10. The optical detection system according to claim 8 further comprising a camera,
wherein the camera is arranged to record a picture of the object,
wherein the processing circuit is arranged to determine a three-dimensional picture of the object based on the determined shape of the object and the picture of the object.

11. A method of determining a shape of an object comprising:
emitting a pattern of laser light, the pattern of laser light comprising at least a first sub pattern and a second sub pattern of laser light,
wherein the first sub patterns has a first polarization,
wherein the second sub pattern has a second polarization;
controlling a coherence of laser light by means of independently controlling subsets of laser emitters of a first sub array and/or a second sub array, wherein at least the laser light emitted by a first subset is not coherent to laser light emitted by a second subset;
receiving laser light of the pattern of laser light reflected by an object; and
determining the shape of the object using the received laser light of the first and the second sub pattern.

12. The laser device according to claim 3, wherein at least a portion of the first sub array and at least a portion of the second sub array are arranged in a hexagonal pattern.

13. A device according to claim 1, wherein the different polarizations are reflected by an object.

14. An optical detection device comprising:
a detector, the detector comprising a camera chip and a polarization filter, wherein the detector is arranged to detect different polarizations of laser light;
a first sub array of laser emitters;
a second sub array of laser emitters; and
a control circuit,
wherein the first sub array emits a first laser light, the first laser light having a first polarization,
wherein the second sub array emits a second laser light, the second laser light having a second polarization,
wherein the second polarization is different from the first polarization,
wherein the control circuit is arranged to change the first polarization and the second polarization,
wherein the first laser light is not coherent to the second laser light,
wherein the control circuit is arranged to control the coherence of the first laser light and the second laser light.

15. The optical detection device according to claim 14,
wherein the laser emitters are Vertical Cavity Surface Emitting Lasers,
wherein the Vertical Cavity Surface Emitting Lasers comprise a grating.

16. The optical detection device according to claim 14, wherein at least a portion of the first sub array and at least a portion of the second sub array are arranged in a checkerboard or hexagonal pattern.

17. The optical detection device according to claim 14,
wherein the polarization filter is a controllable polarization filter,
wherein the detector comprises a control circuit,
wherein the control circuit is arranged to control the polarization filter such that a polarization of the laser light received by the camera can be automatically adjusted.

18. An optical detection system comprising:
a optical detection device according to claim 14;
a receiver circuit; and
a processing circuit;

wherein the optical detection device is arranged to emit a pattern of laser light, wherein the pattern comprises at least a first sub pattern of laser light and a second sub pattern of laser light, wherein the first sub pattern has a first polarization, wherein the second sub pattern has a second polarization, wherein the receiver circuit is arranged to receive the first and the second sub patterns emitted by the laser device and reflected by an object, wherein the processing circuit is arranged to determine a shape of the object using a reflected first pattern and a reflected second sub pattern.

19. The optical detection system according to claim 18, further comprising a controllable polarization filter, wherein the processing circuit is arranged to control a polarization of laser light received by the receiver circuit using the controllable polarization filter.

20. The optical detection system according to claim 18 further comprising a camera, wherein the camera is arranged to record a picture of the object, wherein the processing circuit is arranged to determine a three-dimensional picture of the object based on the determined shape of the object and the picture of the object.

\* \* \* \* \*